(12) United States Patent
Glenn et al.

(10) Patent No.: US 6,359,209 B1
(45) Date of Patent: Mar. 19, 2002

(54) SOLAR PANEL AND SOLAR CELL HAVING IN-PLANE SOLAR CELL INTERCONNECT WITH INTEGRATED DIODE TAB

(75) Inventors: Gregory S. Glenn, Pacific Palisades; Michael L. Rupp, Reseda, both of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/510,837

(22) Filed: Feb. 23, 2000

(51) Int. Cl.[7] .............................................. H01L 31/05
(52) U.S. Cl. ...................... 136/256; 136/244; 439/883; 439/875; 439/880; 439/924.1
(58) Field of Search ................................. 136/244, 256; 439/883, 875, 880, 924.1

(56) References Cited

U.S. PATENT DOCUMENTS

| | | | |
|---|---|---|---|
| 3,819,417 A | | 6/1974 | Haynos |
| 4,193,820 A | | 3/1980 | Thomas |
| 4,652,693 A | * | 3/1987 | Bar-On ........................ 136/251 |
| 5,006,179 A | | 4/1991 | Gaddy |
| 5,100,808 A | * | 3/1992 | Glenn ......................... 136/244 |
| 5,330,583 A | * | 7/1994 | Asai et al. ................... 136/251 |
| 5,616,185 A | * | 4/1997 | Kukulka ..................... 136/244 |

* cited by examiner

*Primary Examiner*—Alan Diamond
(74) *Attorney, Agent, or Firm*—Terje Gudmestad

(57) ABSTRACT

An interconnect for connecting first and second solar cells comprises a base portion having a first distal section and a first intermediate section, with the first distal and intermediate sections being integral with the base portion and capable of fixture to the first solar cell. An extension tab is integral to the first distal section, with the extension tab being capable of fixture to a front side of the second solar cell. A diode tab is integral to the first intermediate section, with the diode tab being capable of fixture to a diode side of the second solar cell, such diode side being on a side opposite to the front side. Solar panels comprising solar cells interconnected with such interconnects are suitable for both terrestrial and non-terrestrial applications.

25 Claims, 6 Drawing Sheets

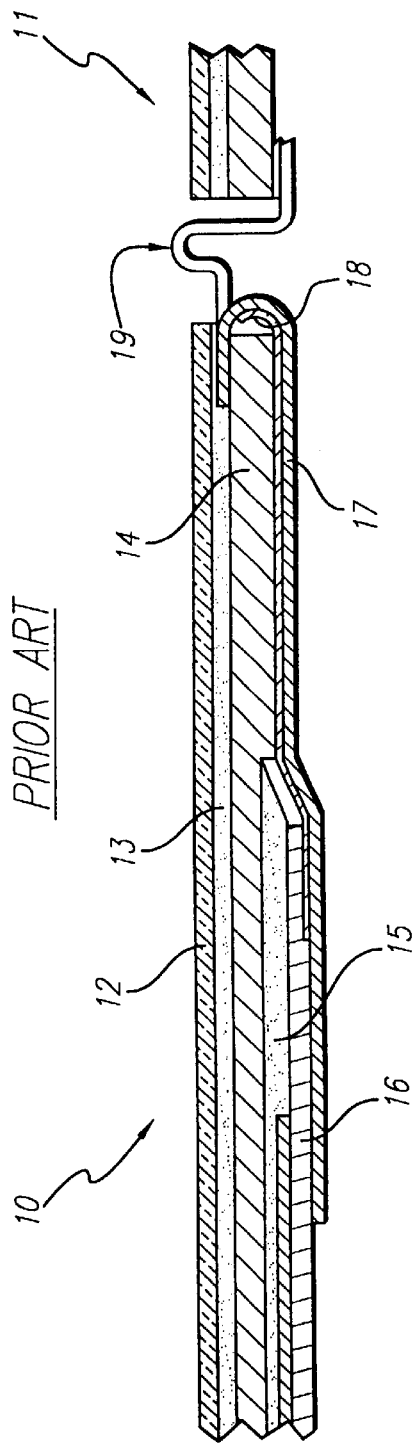
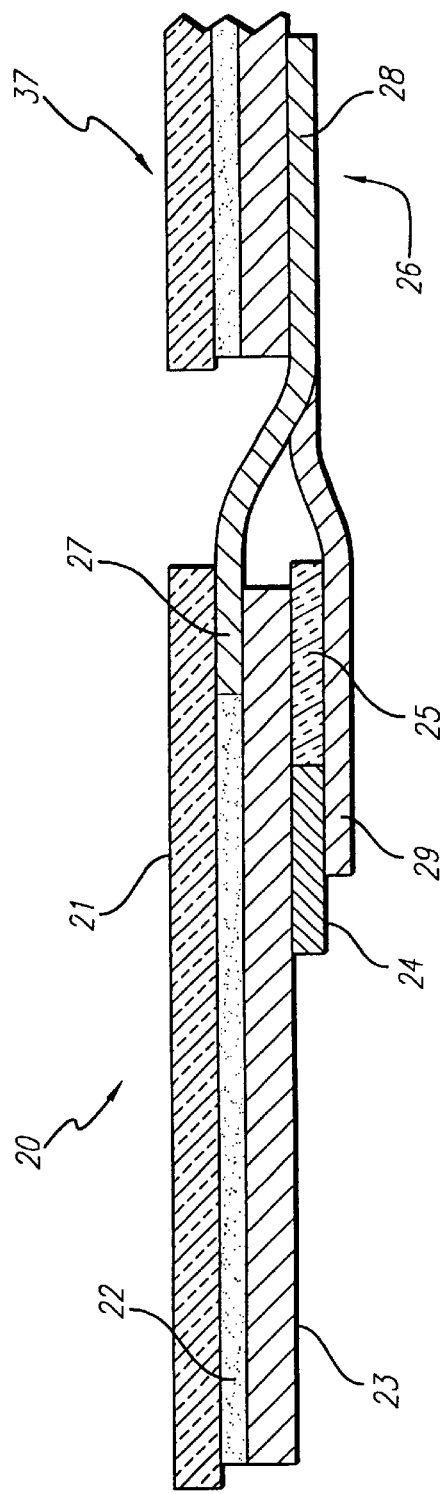
FIG. 1 PRIOR ART
FIG. 2

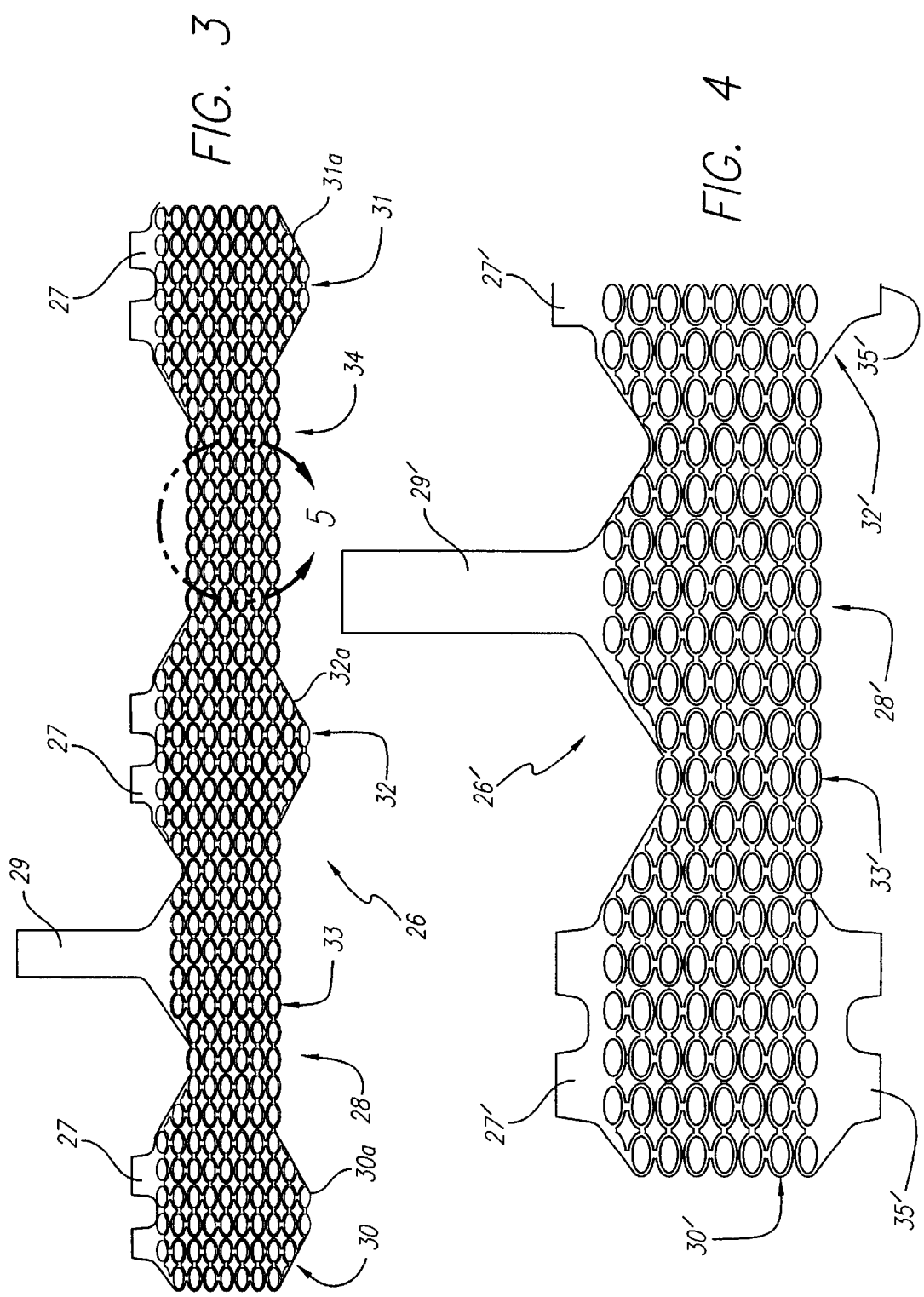

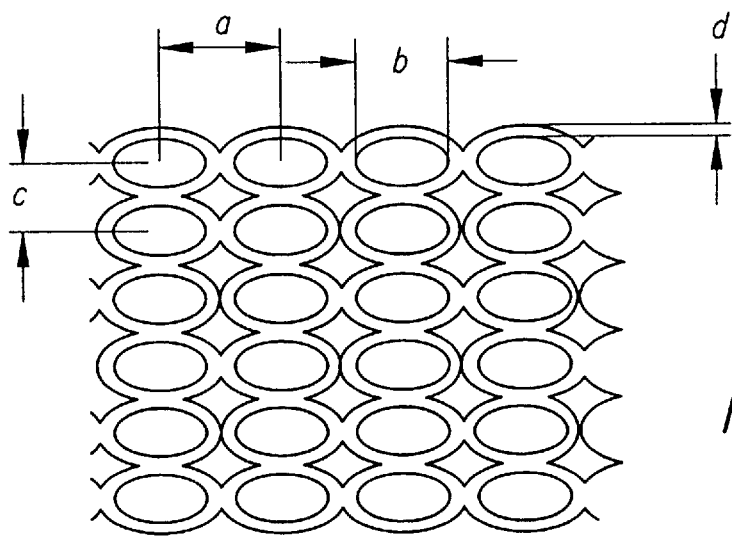
FIG. 5
FIG. 6
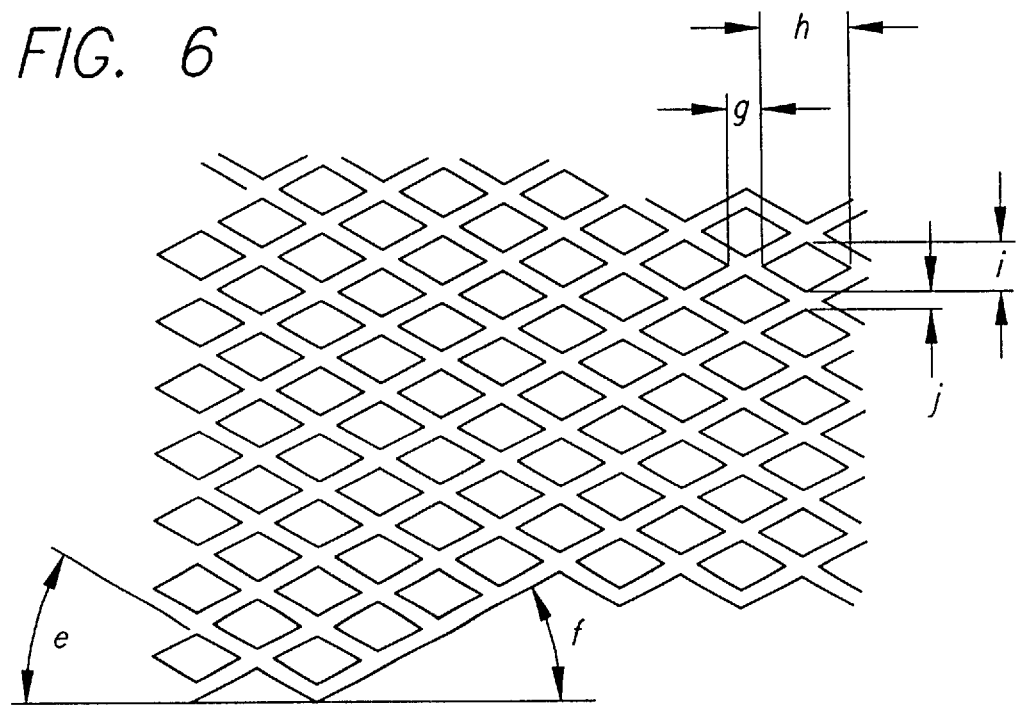

SOLAR PANEL AND SOLAR CELL HAVING IN-PLANE SOLAR CELL INTERCONNECT WITH INTEGRATED DIODE TAB

BACKGROUND OF THE INVENTION

1. Field of the Invention

The present invention generally relates to solar cells and solar cell panels and in particular to solar cell interconnects. More specifically, the invention relates to an improved in-plane solar cell interconnect that supports a diode on one side of the solar cell.

2. Description of Related Art

With the ready availability of solar energy in outer space for a spacecraft such as a satellite, the conversion of solar energy into electrical energy with photovoltaic cells is an obvious choice for producing power. Higher efficiency in power conversion of sunlight to electricity equates to either lighter weight spacecraft or higher payload capacity, both of which have monetary benefit. One method for increasing efficiency is to manufacture solar cells with multiple junctions, or layers having different energy band gaps which have been stacked so that each cell or layer can absorb a different part of the wide energy distribution in the sunlight. Because of the high voltage of these cells compared to silicon and their susceptibility to reverse bias breakdown, there is a requirement to protect each cell with a bypass diode. Attachment of the diode to each cell is in addition to attaching interconnects for the purpose of increasing voltage in a solar cell circuit by series connection. A number of the stacked arrangements or cells is provided in the form of an array on a substrate or multiple substrates.

Interconnects are used in an array of solar cells to electrically connect the cells to one another in series, in parallel or both. They must be designed robust to survive the rigors of the space environment. The individual solar cells and their substrate can be subject to significant mechanical vibration during a launch and thermal cycling during the course of the spacecraft's mission in space. The thermal cycling, in turn, leads to thermal expansion and contraction of the various materials. This can cause stress on the interconnects if there is a coefficient of expansion (CTE) mismatch between the cells and the substrate materials. With greater stress in terms of frequency and magnitude, there can be a shorter life expectancy of the interconnect. With a shorter life expectancy of the interconnect, a solar panel in which the interconnect is utilized will have a shorter life expectancy. Ultimately, the spacecraft on which the solar panel is used will have a shorter life and result in greater costs to replace it.

Various interconnect designs have been attempted in the past. Examples of various interconnects can be found in U.S. Pat. Nos. 5,006,179; 4,193,820; and 3,819,417. Some of the disadvantages of these designs include the need for two types of connections made from two different materials, which tends to complicate manufacturing. Another disadvantage is that the interconnects take up or shade active areas of the tops of the cells. Further, some prior designs provide insufficient flexibility between the cells or prevent the cells in an array from being close to one another, thus increasing the area and mass requirements of the array.

The foregoing designs do not address the issue of an interconnect in the context of a solar cell assembly having a bypass diode. One prior art design, however, that does so is U.S. Pat. No. 5,616,185 wherein a flexible interconnect tab is used to connect a p-contact on one solar cell assembly to an n-contact on an adjacent solar cell assembly. Each solar cell assembly includes a bypass diode on the back (or non-illuminated) side of the solar cell. The diode is connected in opposite polarity with its solar cell so as to provide junction breakdown protection for the solar cell by limiting the reverse voltage that can occur across the cell. Thus, a conductive interconnect that is separate from the interconnect tab connects the anode contact of the diode to the p-contact of the next assembly. However, a drawback to this design is the difficulty in removing and replacing an individual solar cell from an array without damaging adjoining cells and structures.

FIG. 1 depicts another interconnect design that has been used with solar cell assemblies containing a diode on the back side. A first solar cell assembly 10 includes a cover glass 12 disposed over an ohmic bar with adhesive 13. The ohmic bar is on the top surface of a solar cell 14. A wraparound diode tab 17 is fixed to a front side of the assembly 10 and wraps around to the back side of the assembly 10 to hold a diode 16 in place on the back side. Between the diode tab 17 and the solar cell 14 is an insulation 18. An adhesive layer 15 adheres the diode 16 to the solar cell 14. In FIG. 1, an interconnect 19 electrically connects the first solar cell assembly 10 to a second solar cell assembly 11. Typically, three interconnects 19 are used between the adjacent solar cell assemblies 10 and 11, such as when each assembly is about 7 cm×3.5 cm.

For the design in FIG. 1, the need for multiple parts to accomplish connection between the assemblies 11, 12, as well as electrically connect the diode 16, results in multiple processing and handling steps. In turn, there is not only increased manufacturing time and expense, but also more possibilities of solar cell attrition clue to breakage. Additionally, since the diode tab 17 and multiple interconnects 19 are typically welded at the ohmic bar, each weld pulse can degrade the electrical performance of the solar cell assembly 10 due to shunting. A small shunt reduces the electrical output of the solar cell 14 by leaking current across the junction or junctions of the cell 14, thus reducing its conversion efficiency. A severe shunt results in rejecting the expensive cell 14 completely.

Furthermore, the diode tab 17 places a strain on the ohmic weld joint and cover glass 12. Because of the thermal and mechanical stresses imparted on the bonded solar cell 14 in long life missions, the interconnect 19 is typically made with a strong material such as Kovar, Invar, and molybdenum. On the other hand, the strong materials make the interconnect 19 stiffer. When the diode tab 17 is bent around in a wraparound configuration, the tab 17 has a tendency to both delaminate or even shatter a thin cover glass 12, as well as to de-weld from the ohmic bar on the front surface of the solar cell 14. This condition can render the diode 16 useless for protecting the cell 14 from reverse current and also can reduce the ability of the cover glass 12 to protect the cell 14 from radiation damage. These two conditions can then reduce the power of an entire solar cell circuit connected in series with the damaged cell 14.

As can be seen, there is a need for interconnects that achieve the following functions or have the: following characteristics electrical connection between adjacent solar cells, as well as back to front connection for a diode mounted on the backside of a single cell; improved resistance to thermal cycling; flexure in an in-plane configuration; connection to the cell with a minimum number of processing steps and cell interconnection that minimizes the number of welds so that the potential for cell damage is minimized. An inplane solar cell interconnect is also needed to reduce the potential amount of shading to active areas of the cell and to facilitate cleaning of bonding adhesive off the top surface of at cover glass.

SUMMARY OF THE INVENTION

The present invention is directed to an improved interconnect for connecting first and second solar cells. The interconnect comprises a base portion having a first distal section and a first intermediate section, with the first distal and intermediate sections being integral with the base portion and capable of fixture to the first solar cell. An extension tab is integral to the first distal section, with the extension tab being capable of fixture to a front side of the second solar cell. A diode tab is integral to the first intermediate section, with the diode tab being capable of fixture to a diode side of the second solar cell, such diode side being on a side opposite to the front side. The present invention is applicable both to solar cells used for terrestrial applications as well as non-terrestrial applications such as on satellites and airplanes and high altitude platforms and vehicles.

These and other features, aspects and advantages of the present invention will become better understood with reference to the following drawings, description, and claims.

BRIEF DESCRIPTION OF THE DRAWINGS

FIG. 1 is a side cross-sectional view of a solar cell assembly with an interconnect and diode tab according to a prior art design;

FIG. 2 is side cross-sectional view of a solar cell assembly with an interconnect according to an embodiment of the present invention;

FIG. 3 is a top plan view of an interconnect according to an embodiment of the present invention;

FIG. 4 is a partial top plan view of an interconnect according to another embodiment of the present invention;

FIG. 5 is a partial top plan view of a base portion of an interconnect according to a first embodiment of the present invention;

FIG. 6 is a partial top plan view of a base portion of an interconnect according to a second embodiment of the present invention;

DESCRIPTION OF THE PREFERRED EMBODIMENTS

Figure 11:
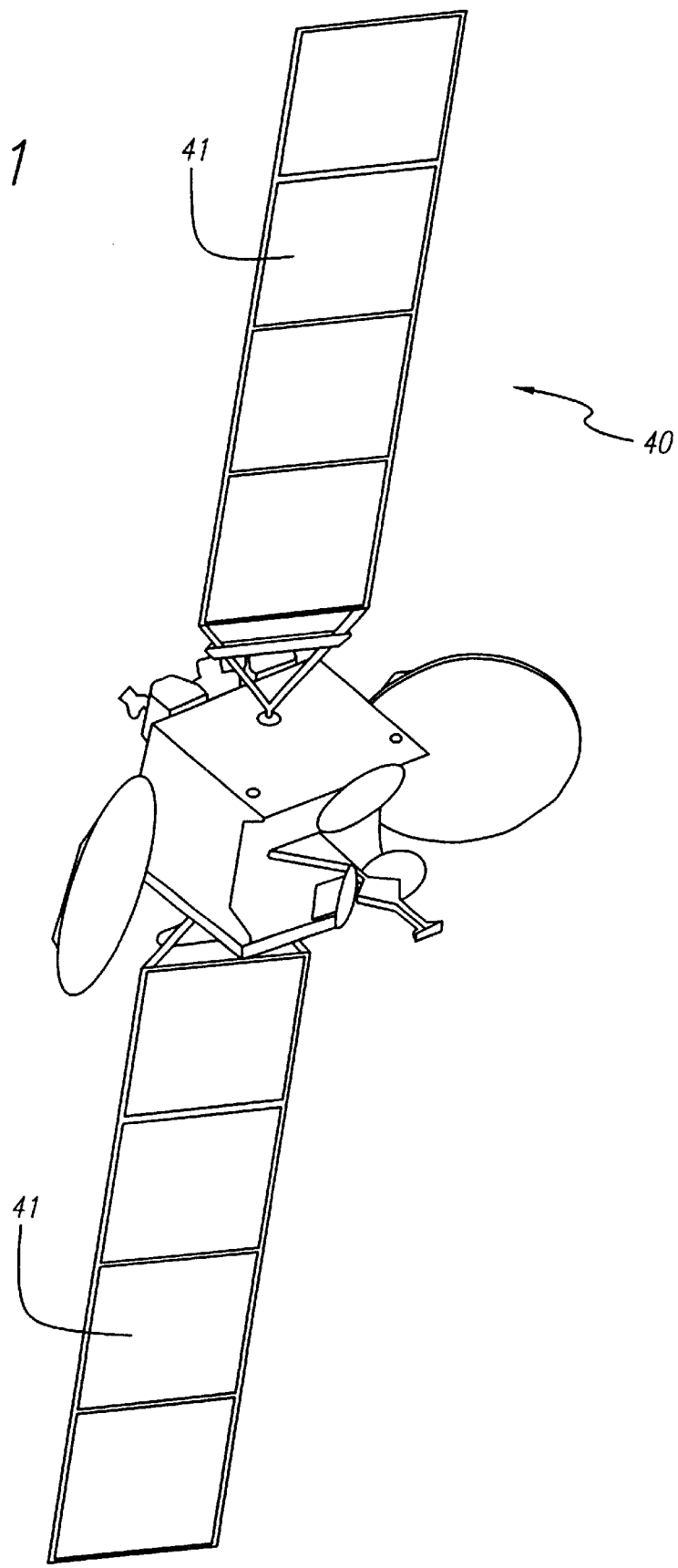
FIG. 11 is a perspective view of a spacecraft having a solar cell panel in which the present invention can be utilized.

FIG. 2 is a side cross-sectional view of a two solar cell assemblies 20, 37 having an interconnect 26 affixed therebetween according to one embodiment of the present invention. The solar cell assemblies 20, 37 do not form a part of the present invention but are illustrated for purposes of understanding the design and operation of the interconnect 26. Accordingly, the solar cell assemblies 20, 37 can be constructed according to any well-known design in the art, such as the following. Additionally, while the present invention can be used in various contexts, the present invention is particularly useful in the context of a satellite 40 (FIG. 11) having a solar panel 41 comprising a plurality of solar cell assemblies 20, 37.

The solar cell assembly 20 includes a cover glass 21 that serves to protect the assembly 20 from radiation damage. The cover glass 21 is typically made of materials such as fused silica or microsheet. Underneath the cover glass 21, as viewed from FIG. 2, is an adhesive layer 22 that adheres the cover glass 21 to a front (or illuminated) side of a solar cell 23. The adhesive layer 22 can be made of various materials, such as polymeric silicone, and is oftentimes about 3 mils thick. The solar cell 23 is constructed of semiconductor layers according to well known methods in the art. Although it can vary, the solar cell 23 is typically on the order of about 7 mils thick. A bypass diode 24 is usually about 3 mils thick and affixed to a back (or non-illuminated) side of the solar cell 23 which is opposite of the front side. Also affixed to the back side of the solar cell 23 is an insulation layer 25 that insulates the solar cell 23 from a diode tab 29 of the interconnect 26. The insulation layer 25 may be made, for example, from kapton with acrylic adhesive, and is oftentimes about 1 mil thick.

The interconnect 26, in this embodiment, includes an integral base or stress relief portion 28, a plurality of integral extension tabs 27, and an integral diode tab 29. The diode tab 29 supports the diode 24 in position at the back side of the solar cell 23, as well as providing electrical connection from the back side and to the front side of the assembly 20. The extension tabs 27 connect an ohmic bar (not shown) located on the front side of the solar cell 23 to a second solar cell assembly 37. In FIG. 2, the second solar cell assembly 37 can be identical in construction as the first solar cell assembly 20, but is only partially shown in FIG. 2. While subject to variation, the distance between the first and second solar cell assemblies is about 10 to 30 mils. Given the above component thicknesses in the solar cell assembly 20, the height between the extension tabs 27 and the diode tab 29 is about 8 mils. The base portion 28, extension tabs 27 and diode tab 29 are each about 1–2 mils thick, which can include a silver coating, as described below, on opposing surfaces of the interconnect 26.

The base or stress relief portion 28 comprises an integrally formed first distal section 30, a second distal section 31, and a mid section 32 therebetween (FIG. 3). The stress relief portion 28 further includes a first intermediate section 33 that is disposed between the first distal section 30 and the mid section 32. A second intermediate section 34 of the stress relief portion 28 is disposed between the mid section 32 and the second distal section 31. In the embodiment shown in FIG. 3, the mid sections 33, 34 have a rectangular configuration. The first and second distal sections 30, 31, as well as the mid section 32, have an octagon configuration. With such octagon configurations, the first distal section 30 includes a connecting portion 30a, the second distal section 31 includes a connecting portion 31a, and the mid section 32 includes a connecting portion 32a. All of the connecting portions 30a, 31a, 32a are on a side of their respective sections opposite the extension tabs 27. Notwithstanding the foregoing, the present invention contemplates that other configurations can be utilized.

In FIG. 3, the plurality of extension tabs 27 and the diode tab 29 are integrally formed with the base portion 28 along a first edge or side that can be immediately adjacent the first solar cell assembly 20. The second or opposite edge of the base portion 28 can then be immediately adjacent the second solar cell assembly 37. In so doing, the connecting portions 30a, 31a, 32a can be affixed to the second solar cell assembly 37, such as at its back side (FIG. 2) by soldering. Before attaching the cell 20 to cell 37, the extension tabs 27 are affixed (such as by welding) onto the front side of the first solar cell assembly 20 and the diode tab 29 can be affixed onto the diode or back side of the first solar cell assembly 20 (FIG. 1). While the preferred embodiment shown (FIG. 3) includes two extension tabs 27 integrally formed on the first and second distal sections 30, 31, as well as the mid section 32, more or less than two tab 27 can be used. Further, the number of tabs 27 need not be the same for each section 30, 31, 32.

In an alternative embodiment partially shown in FIG. 4, an interconnect 26' includes a base portion 28' that comprises a first distal section 30', an intermediate section 33' and a mid section 32'. On a first side of the base portion 28' are a plurality of first extension tabs 27'. However, unlike the embodiment above, this embodiment includes a plurality second extension tabs 35' positioned on a second side of the base portion 28' that is opposite the first extension tabs 27'. In effect, the second extension tabs 35' take the place of the connecting portions 30a, 31a, 32a of the above embodiment. FIG. 4 illustrates the preferred embodiment for welding of cell assembly 20 to cell assembly 37. The preferred method of fixture is by welding because of it being a less costly and more reliable process than soldering.

In either of the two embodiments above, it can be seen that the interconnect 26 (26') provides a substantially in-plane profile to the first and second solar cell assemblies 20, 37. In other words, the interconnect 26 (26'), when viewed from the side, extends minimally above and below the heights of the solar cell assemblies 20, 37. By so doing, the interconnect 26 (26') minimizes the amount of shading that can occur to the active or front sides of the assemblies 20, 37. An in-plane profile also minimizes the amount of adhesive that can be transferred to the front sides of the assemblies 20, 37. As practiced in the art, the assemblies 20, 37 are typically adhered at their back sides to a substrate. The adhesive used for bonding tends to flow up between adjoining cell assemblies, over an interconnect, and across the front sides of the assemblies, particularly when the interconnect is higher than the heights of the assemblies.

Preferably, the interconnect 26 is made of strong material such as Invar, Kovar or molybdenum. A silver coating is used over the abovementioned material, which enables easier welding of the interconnect 26 to the silver that is typically used on the front and back sides of the solar cell 23. The silver coating on the interconnect 26 may be a plated or clad material. The latter is preferred because it has a tighter thickness tolerance and there is less chance of contamination. Plated material is not as easily controlled as cladding and the silver thickness can vary over 200 micro-inches per side. Plating also can result in contamination from uncleaned plating solutions or oils.

Figure 8:
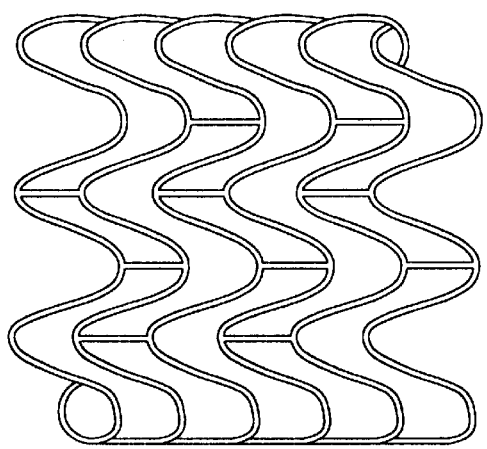
FIG. 8 is a partial top plan view of a base portion of an interconnect according to a fourth embodiment of the present invention.
Figure 9:
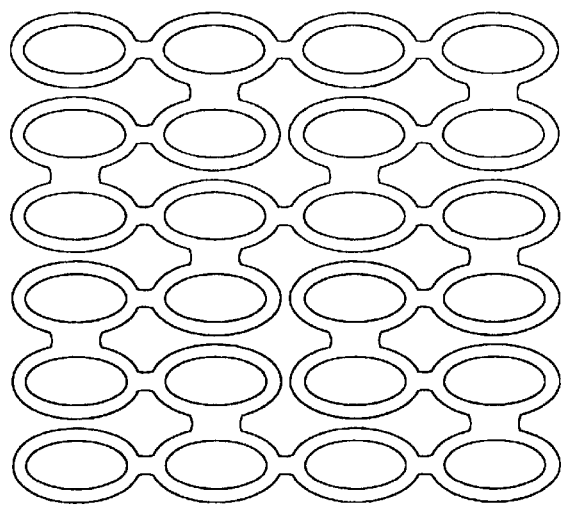
FIG. 9 is a partial top plan view of a base portion of an interconnect according to a fifth embodiment of the present invention.

In referring again to FIGS. 3 and 4, the area of the base or stress relief portion 28 can be seen as constructed with a material having a periodic pattern. In the embodiments shown in FIGS. 3 and 4, the periodic pattern is in the shape of an oval. However, it can be understood that other periodic patterns can be used. For example, FIG. 5 depicts another oval pattern, but which has more connections between adjoining ovals when compared to that in FIG. 4. In FIG. 6, the pattern is in the form of diamonds, FIG. 7 is in the form of S's, FIG. 8 is in the form of sine waves, and FIG. 9 is in the form of yet another embodiment of ovals.

The particular size of the shapes constituting the pattern in the base portion 28 can vary. However, as examples, in FIG. 5 the distance "a" from one center of an oval to the next center in a lengthwise direction can vary between about 0.040" to 0.080". The lengthwise distance "b" of a single oval can vary between about 0.030" to 0.100. The distance "c" from one center of an oval to the next center based on height can vary between about 0.020" to 0.050". The distance "d" of the thickness of an oval can vary between about 0.003" to 0.010".

In FIG. 6, an angle "e" varies between about 30° to 60°, as does angle "f." The end-to-end distance "g" between two adjacent diamonds is between about 0.006" to 0.020". The length of a diamond "h" varies from about 0.020" to 0.060". The height of a diamond "i" is about 0.010" to 0.040". The height-to-height distance "j" between two diamonds is about 0.006" to 0.020.

Figure 7:
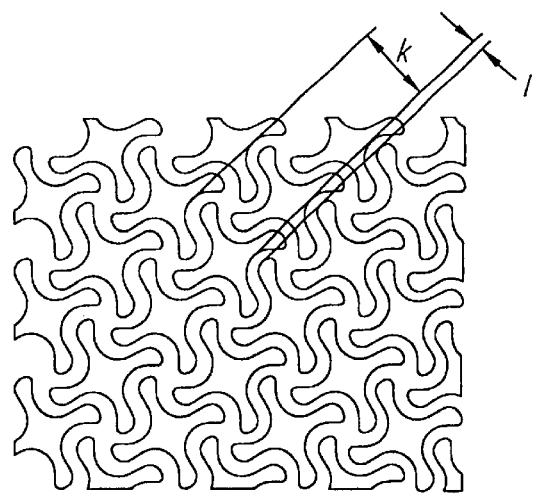
FIG. 7 is a partial top plan view of a base portion of an interconnect according to a third embodiment of the present invention.

For FIG. 7, a distance "k" between two S's varies from about 0.020" to 0.100". A thickness "I" of an S varies from about 0.003" to 0.010".

EXAMPLES

Figure 10:
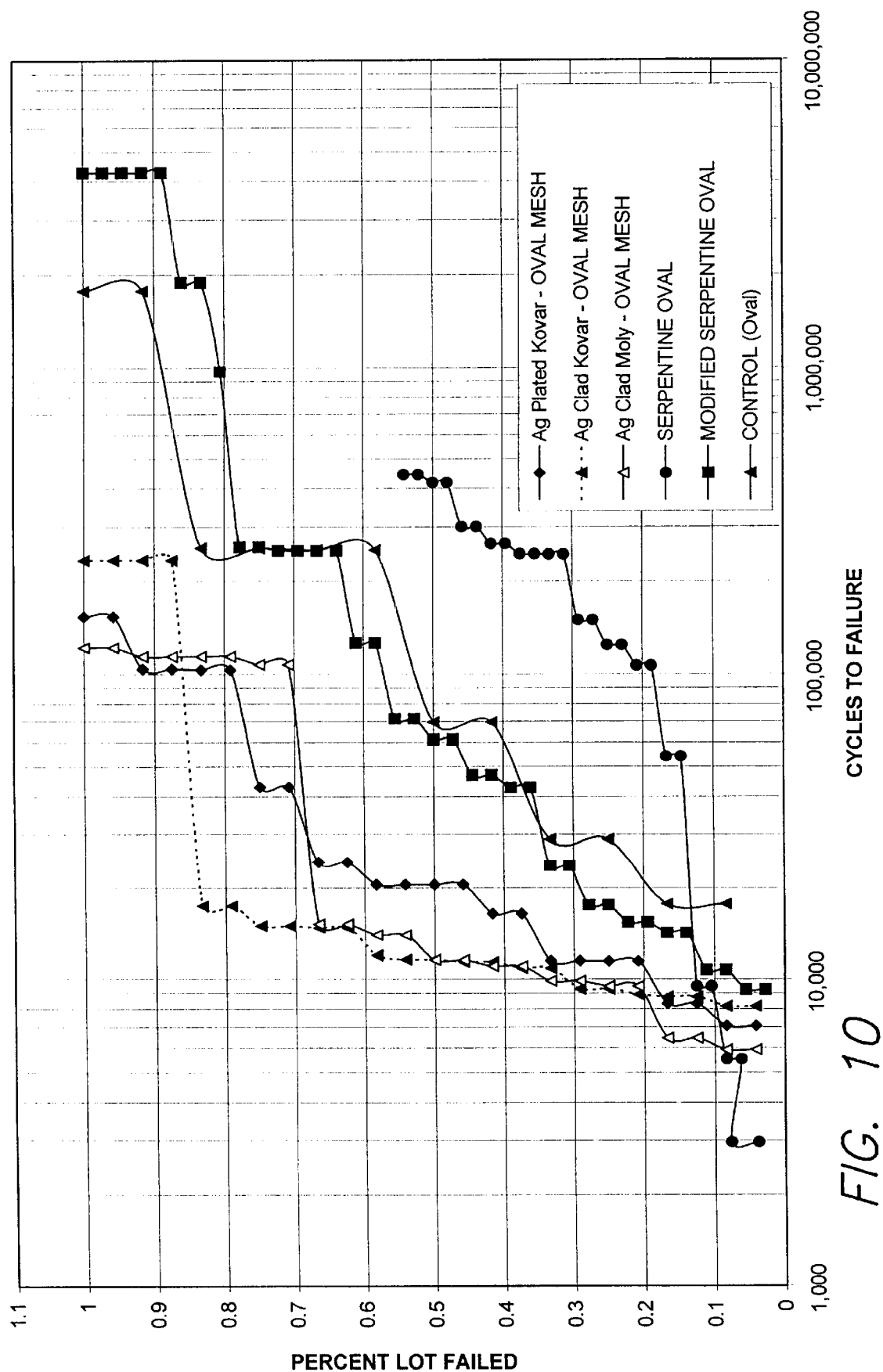
FIG. 10 is a graph of percent of lots failed versus cycles to failure for various embodiments of the present invention.

FIG. 10 depicts the test results of seven embodiments of the interconnect 26 that was subjected to cycled flexures of 5 mils in a lateral direction. The embodiment (A) was made of silver plated Kovar in the diamond configuration of FIG. 6. The embodiment (B) was made of silver plated Kovar, in the oval configuration of FIG. 5. The embodiment (C) was made of silver clad Kovar in the diamond configuration of FIG. 6. Silver clad Kovar in an oval configuration of FIG. 5 was used for embodiment (D). Silver clad molybdenum in a diamond configuration of FIG. 6 was used for embodiment (E). Embodiment (F) was silver clad molybdenum in an oval configuration of FIG. 5. Embodiment (G) was silver clad kovar in an oval configuration of FIG. 9.

The graphed results in FIG. 10 indicate that embodiment (G) provided the best results in terms of failure rate at high cycles. However, all embodiments provided acceptable results when it is considered that in a 15 year GEO space mission, the interconnects undergo only about 1800 thermal cycles and in an LEO space mission the interconnects undergo only about 20,000 to 40,000 cycles in a typical spacecraft lifetime. Furthermore, in practice, the interconnects undergo flexure of about 2–3 mils on a graphite. substrate, even though the test condition was 5 mils to expedite the test.

As can be appreciated by those skilled in the art, the present invention provides an apparatus that connects solar cells in series, as well as connect a diode from the back of a cell to the front. The present invention also provides improved resistance to thermal cycling and increased flexure. The interconnect of the present invention can be manufactured with a minimum number of processing steps, as well as a minimum number of welds so that the potential for cell damage is minimized.

The in-plane nature of the present invention also reduces the potential amount of shading to active areas of the cell. At the same time, the in-plane feature reduces breakage associated with cleaning cured adhesive from the top surface of fragile, germanium or gallium arsenide based thin solar cells. This results from the fact that cell masking can lay flat in the inter-cell spaces, thus reducing adhesive squeeze-out onto the top of the assembly. The invention eliminates the need for wrapping a tab around the front and back of the cell, thereby eliminating the potential for cover glass breakage and tab de-welding. This is because the diode tab of the present invention is straight and not creating a spring force by being wrapped around an edge of the cell.

It should be understood, of course, that the foregoing relates to preferred embodiments of the invention and that modifications may be made without departing from the spirit and scope of the invention as set forth in the following claims.

What is claimed is:

1. An interconnect for connecting first and second solar cells, comprising:
   a base portion capable of fixture to said second solar cell, wherein said base portion comprises a distal section, a mid section, and an intermediate section;
   an extension tab integral to said base portion and capable of fixture to said first solar cell; and
   a diode tab integral to said base portion, said diode tab adjacent said intermediate section, and capable of fixture to a diode in said first solar cell.

2. The interconnect of claim 1, wherein said base portion comprises a first distal section and a second distal section.

3. The interconnect of claim 1, wherein said base portion comprises a plurality of intermediate sections.

4. The interconnect of claim 1, wherein said base portion comprises a material in a periodic pattern.

5. The interconnect of claim 1, further comprising a plurality of extension tabs.

6. An interconnect for connecting first and second solar cells, comprising:
   a base portion having a distal section and an intermediate section, said distal and intermediate sections being capable of fixture to said first solar cell;
   an extension tab fixed to said distal section, said extension tab being capable of fixture to said second solar cell; and
   a diode tab fixed to said intermediate section, said diode tab being capable of fixture to a diode in said second solar cell.

7. The interconnect of claim 6, wherein said distal and intermediate sections are integral with said base portion.

8. The interconnect of claim 6, wherein said extension tab is integral with said distal section.

9. The interconnect of claim 6, further comprising a plurality of extension tabs fixed to said distal section.

10. The interconnect of claim 6, wherein said diode tab is integral with said intermediate section.

11. The interconnect of claim 6, wherein said extension tab is capable of fixture to a first side of said second solar cell and said diode tab is capable of fixture to a second side of said second solar cell.

12. An interconnect for connecting first and second solar cells, comprising:
   a base portion having a first distal section and a first intermediate section, said first distal and intermediate sections being integral with said base portion and capable of fixture to said first solar cell;
   an extension tab integral to said first distal section, said extension tab being capable of fixture to a front side of said second solar cell; and
   a diode tab integral to said first intermediate section, said diode tab being capable of fixture to a diode side of said second solar cell, said diode side being on a side opposite to said front side.

13. The interconnect of claim 12, further comprising a second distal section integral with said base portion.

14. The interconnect of claim 13, wherein said second distal section is disposed on one side of said first intermediate section and said first distal section is disposed on an opposite side of said first intermediate section.

15. The interconnect of claim 12, further comprising a mid section integral with said base portion.

16. The interconnect of claim 15, wherein said mid section is disposed on one side of said first intermediate section and said first distal section is disposed on an opposite side of said first intermediate section.

17. The interconnect of claim 15, further comprising a second intermediate section integral with said base portion.

18. The interconnect of claim 17, wherein said second intermediate section is on one side of said mid section and said first intermediate section is disposed on an opposite side of said mid section.

19. An interconnect for connecting first and second solar cells in a solar cell panel, comprising:
   a base portion having a plurality of sections including a plurality of intermediate sections and a plurality of connecting portions, said plurality of connecting portions being capable of fixture to said second solar cell;
   an extension tab integral to said base portion, said extension tab being capable of fixture to a front side of said first solar cell; and
   a diode tab integral to said base portion adjacent one of said intermediate sections, said diode tab being capable of fixture to a diode side of said first solar cell.

20. The solar panel of claim 19, wherein said plurality of sections further comprises a first distal section, a second distal section, and a mid section disposed therebetween.

21. The solar panel of claim 20, wherein said extension tab is fixed to either said first distal section or said second distal section.

22. The interconnect of claim 20, wherein said plurality of intermediate sections is disposed among said first distal section, second distal section and mid section.

23. An interconnect for connecting first and second solar cells in a solar cell panel, comprising:
   a base portion having a plurality of sections capable of fixture to said second solar cell, wherein said plurality of sections comprises a first distal section, a second distal section, and a mid section disposed therebetween, said base portion further comprising a plurality of intermediate sections disposed among said first distal section, second distal section and mid section;
   at least on extension tab integral to said base portion, said at least one extension tab being capable of fixture to a front side of said first solar cell; and
   a diode tab integral to said base portion, said diode tab being capable of fixture to a diode side of said first solar cell, wherein said diode tab is fixed to one of said intermediate sections.

24. The solar panel of claim 19, further comprising a plurality of extension tabs fixed to a first edge of said plurality of sections.

25. The interconnect of claim 24, further comprising a plurality of second extension tabs fixed to a second edge of said plurality of sections and capable of fixture to said first solar cell, said second edge being disposed opposite to said first edge.

* * * * *